United States Patent
Crandell et al.

(10) Patent No.: US 8,525,193 B2
(45) Date of Patent: *Sep. 3, 2013

(54) LAYERED STRUCTURE FOR USE WITH HIGH POWER LIGHT EMITTING DIODE SYSTEMS

(75) Inventors: Wm. Todd Crandell, Minnetonka, MN (US); Anthony Mitchell Johnson, Minneapolis, MN (US); Tony Stephen Schweitzer, Champlin, MN (US); H. Vic Holec, Mendota Heights, MN (US)

(73) Assignee: Metrospec Technology LLC, Mendota Heights, MN (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/411,322

(22) Filed: Mar. 2, 2012

(65) Prior Publication Data

US 2012/0162990 A1 Jun. 28, 2012

Related U.S. Application Data

(63) Continuation of application No. 12/043,424, filed on Mar. 6, 2008, now Pat. No. 8,143,631.

(51) Int. Cl.
*H01L 29/18* (2006.01)
(52) U.S. Cl.
USPC 257/88; 257/98; 257/E33.054; 257/E33.055; 257/E33.059; 257/E33.069
(58) Field of Classification Search
USPC ....... 257/88, 98, E33.054, E33.055, E33.059, 257/E33.069
See application file for complete search history.

(56) References Cited

U.S. PATENT DOCUMENTS

| 2,697,811 A | 12/1954 | Deming |
| 2,731,609 A | 1/1956 | Sobell, III |
| 3,086,189 A | 4/1963 | Robbins |
| 3,270,251 A | 8/1966 | Evans |

(Continued)

FOREIGN PATENT DOCUMENTS

| JP | 01319993 | 12/1989 |
| JP | 05090726 | 4/1993 |

OTHER PUBLICATIONS

"Final Office Action", mailed Aug. 7, 2012 in U.S. Appl. No. 13/190,639, "Interconnectable Circuit Boards," (25 pages).

(Continued)

*Primary Examiner* — Brook Kebede
(74) *Attorney, Agent, or Firm* — Pauly, Devries, Smith & Deffner. L.L.C.

(57) ABSTRACT

A layered structure for use with a high power light emitting diode system comprises an electrically insulating intermediate layer interconnecting a top layer and a bottom layer. The top layer, the intermediate layer, and the bottom layer form an at least semi-flexible elongate member having a longitudinal axis and a plurality of positions spaced along the longitudinal axis. The at least semi-flexible elongate member is bendable laterally proximate the plurality of positions spaced along the longitudinal axis to a radius of at least 6 inches, twistable relative to its longitudinal axis up to 10 degrees per inch, and bendable to conform to localized heat sink surface flatness variations having a radius of at least 1 inch. The top layer is pre-populated with electrical components for high wattage, the electrical components including at least one high wattage light emitting diode at least 1.0 Watt per 0.8 inch squared.

24 Claims, 12 Drawing Sheets

(56) References Cited

U.S. PATENT DOCUMENTS

| | | | |
|---|---|---|---|
| 3,401,369 | A | 9/1968 | Plamateer et al. |
| 4,173,035 | A | 10/1979 | Hoyt |
| 4,250,536 | A | 2/1981 | Barringer et al. |
| 4,526,432 | A | 7/1985 | Cronin et al. |
| 4,533,188 | A | 8/1985 | Miniet |
| 4,618,194 | A | 10/1986 | Kwilos |
| 4,795,079 | A | 1/1989 | Yamada |
| 4,991,290 | A | 2/1991 | MacKay |
| 5,001,605 | A | 3/1991 | Savagian et al. |
| 5,176,255 | A | 1/1993 | Seidler |
| 5,375,044 | A | 12/1994 | Guritz |
| 5,404,044 | A | 4/1995 | Booth et al. |
| 5,440,454 | A | 8/1995 | Hashimoto et al. |
| 5,511,719 | A | 4/1996 | Miyake et al. |
| 5,575,554 | A | 11/1996 | Guritz |
| 5,920,465 | A | 7/1999 | Tanaka |
| 6,095,405 | A | 8/2000 | Kim et al. |
| 6,113,248 | A | 9/2000 | Mistopoulos et al. |
| 6,137,816 | A | 10/2000 | Kinbara |
| 6,239,716 | B1 | 5/2001 | Pross et al. |
| 6,299,337 | B1 | 10/2001 | Bachl et al. |
| 6,372,997 | B1 | 4/2002 | Hill et al. |
| 6,428,189 | B1 | 8/2002 | Hochstein |
| 6,449,836 | B1 | 9/2002 | Miyake et al. |
| 6,481,874 | B2 | 11/2002 | Petroski |
| 6,517,218 | B2 | 2/2003 | Hochstein |
| 6,601,292 | B2 | 8/2003 | Li et al. |
| 6,657,297 | B1 * | 12/2003 | Jewram et al. ............ 257/720 |
| 6,729,888 | B2 | 5/2004 | Imaeda |
| 6,784,027 | B2 | 8/2004 | Streubel |
| 6,833,526 | B2 | 12/2004 | Sinkunas et al. |
| 6,846,094 | B2 | 1/2005 | Luk |
| 6,851,831 | B2 | 2/2005 | Karlicek, Jr. et al. |
| 6,897,622 | B2 | 5/2005 | Lister |
| 6,898,084 | B2 | 5/2005 | Misra |
| 6,936,855 | B1 | 8/2005 | Harrah |
| 6,966,674 | B2 | 11/2005 | Tsai |
| 6,991,473 | B1 | 1/2006 | Balcome et al. |
| 6,996,674 | B2 | 2/2006 | Chiu et al. |
| 7,023,147 | B2 | 4/2006 | Colby et al. |
| 7,114,831 | B2 | 10/2006 | Popovich et al. |
| 7,149,097 | B1 | 12/2006 | Shteynberg et al. |
| 7,210,818 | B2 | 5/2007 | Luk et al. |
| 7,253,449 | B2 | 8/2007 | Wu |
| 7,262,438 | B2 | 8/2007 | Mok et al. |
| 7,276,861 | B1 | 10/2007 | Shteynberg et al. |
| 7,284,882 | B2 | 10/2007 | Burkholder |
| 7,331,796 | B2 | 2/2008 | Hougham et al. |
| 7,377,669 | B2 | 5/2008 | Farmer et al. |
| 7,394,027 | B2 | 7/2008 | Kaluzni et al. |
| 7,397,068 | B2 | 7/2008 | Park et al. |
| 7,448,923 | B2 | 11/2008 | Uka |
| 7,502,846 | B2 | 3/2009 | McCall |
| 7,573,210 | B2 | 8/2009 | Ashdown et al. |
| 7,583,035 | B2 | 9/2009 | Shteynberg et al. |
| 7,598,685 | B1 | 10/2009 | Shteynberg et al. |
| 7,656,103 | B2 | 2/2010 | Shteynberg et al. |
| 7,665,999 | B2 | 2/2010 | Hougham et al. |
| 7,696,628 | B2 | 4/2010 | Ikeuchi et al. |
| 7,710,047 | B2 | 5/2010 | Shteynberg et al. |
| 7,710,050 | B2 | 5/2010 | Preston et al. |
| 7,800,315 | B2 | 9/2010 | Shteynberg et al. |
| 7,852,009 | B2 | 12/2010 | Coleman et al. |
| 7,852,300 | B2 | 12/2010 | Shteynberg et al. |
| 7,880,400 | B2 | 2/2011 | Zhou et al. |
| 7,888,881 | B2 | 2/2011 | Shteynberg et al. |
| 7,902,769 | B2 | 3/2011 | Shteynberg et al. |
| 7,902,771 | B2 | 3/2011 | Shteynberg et al. |
| 7,952,294 | B2 | 5/2011 | Shteynberg et al. |
| 7,956,554 | B2 | 6/2011 | Shteynberg et al. |
| 7,980,863 | B1 | 7/2011 | Holec et al. |
| 8,004,211 | B2 | 8/2011 | Van Erp |
| 8,007,286 | B1 | 8/2011 | Holec et al. |
| 8,067,896 | B2 | 11/2011 | Shteynberg et al. |
| 8,075,477 | B2 | 12/2011 | Nakamura et al. |
| 8,124,429 | B2 | 2/2012 | Norman |
| 8,143,631 | B2 * | 3/2012 | Crandell et al. ............ 257/88 |
| 8,232,735 | B2 | 7/2012 | Shteynberg et al. |
| 8,242,704 | B2 | 8/2012 | Lethellier |
| 8,253,349 | B2 | 8/2012 | Shteynberg et al. |
| 8,253,666 | B2 | 8/2012 | Shteynberg et al. |
| 8,264,169 | B2 | 9/2012 | Shteynberg et al. |
| 8,264,448 | B2 | 9/2012 | Shteynberg et al. |
| 2003/0052594 | A1 | 3/2003 | Matsui et al. |
| 2003/0072153 | A1 | 4/2003 | Matsui et al. |
| 2003/0079341 | A1 | 5/2003 | Miyake et al. |
| 2003/0094305 | A1 | 5/2003 | Ueda |
| 2003/0098339 | A1 | 5/2003 | Totani et al. |
| 2003/0199122 | A1 | 10/2003 | Wada et al. |
| 2003/0223210 | A1 | 12/2003 | Chin |
| 2004/0060969 | A1 | 4/2004 | Imai et al. |
| 2004/0087190 | A1 | 5/2004 | Miyazawa et al. |
| 2004/0090403 | A1 | 5/2004 | Huang |
| 2004/0239243 | A1 | 12/2004 | Roberts et al. |
| 2004/0264148 | A1 | 12/2004 | Burdick, Jr. et al. |
| 2005/0272276 | A1 | 12/2005 | Ooyabu |
| 2006/0038542 | A1 | 2/2006 | Park et al. |
| 2007/0157464 | A1 | 7/2007 | Jeon et al. |
| 2007/0210722 | A1 | 9/2007 | Konno et al. |
| 2007/0257623 | A1 | 11/2007 | Johnson et al. |
| 2008/0191642 | A1 | 8/2008 | Slot et al. |
| 2008/0254653 | A1 | 10/2008 | Uka |
| 2008/0310141 | A1 | 12/2008 | Mezouari |
| 2008/0311771 | A1 | 12/2008 | Cho |
| 2009/0079357 | A1 | 3/2009 | Shteynberg et al. |
| 2009/0117373 | A1 | 5/2009 | Wisniewski et al. |
| 2009/0205200 | A1 | 8/2009 | Rosenblatt et al. |
| 2009/0230883 | A1 | 9/2009 | Haug |
| 2009/0251068 | A1 | 10/2009 | Holec et al. |
| 2009/0301544 | A1 | 12/2009 | Minelli |
| 2010/0026208 | A1 | 2/2010 | Shteynberg et al. |
| 2010/0109536 | A1 | 5/2010 | Jung et al. |
| 2010/0110682 | A1 | 5/2010 | Jung et al. |
| 2010/0213859 | A1 | 8/2010 | Shteynberg et al. |
| 2010/0220046 | A1 | 9/2010 | Plötz et al. |
| 2010/0308738 | A1 | 12/2010 | Shteynberg et al. |
| 2010/0308739 | A1 | 12/2010 | Shteynberg et al. |
| 2011/0096545 | A1 | 4/2011 | Chang |
| 2011/0115411 | A1 | 5/2011 | Shteynberg et al. |
| 2011/0121754 | A1 | 5/2011 | Shteynberg et al. |
| 2011/0309759 | A1 | 12/2011 | Shteynberg et al. |
| 2011/0311789 | A1 | 12/2011 | Loy et al. |
| 2012/0081009 | A1 | 4/2012 | Shteynberg et al. |
| 2012/0081018 | A1 | 4/2012 | Shteynberg et al. |

OTHER PUBLICATIONS

"Non-Final Office Action", mailed Aug. 22, 2012 in co-pending U.S. Appl. No. 13/158,149, "Flexible Circuit Board Interconnection and Methods," (27pages).

Final Office Action, mailed Aug. 3, 2012 in U.S. Appl. No. 12/419,879, "Solid State Lighitng Circuit and Controls," (17 pages).

"Notice of Allowance", mailed Dec. 3, 2012 in co pending U.S. Appl. No. 12/419,879, "Solid State Lighting Circuit and Controls" (17 pages).

"Notice of Allowance", mailed Nov. 26, 2012 in co-pending U.S. Appl. No. 13/190,639, "Interconnectable Circuit Board," (14 pages).

"Response to Final Office Action", mailed Aug. 7, 2012, in co-pending U.S. Appl. No. 13/190,639, filed Nov. 7, 2012, 14 pages.

"Response to Non-Final Office Action", mailed Aug. 3, 2012, in co-pending U.S. Appl. No. 12/419,879, filed Nov. 5, 2012, 7 pages.

"Response to Final Office Action", mailed Mar. 15, 2012, in co-pending U.S. Appl. No. 12/419,879, filed Jun. 15, 2012 (8 pages).

"Response to Non-Final Office Action", mailed Jul. 26, 2011, in co-pending U.S. Appl. No. 12/419,879, filed Dec. 27, 2011, (7 pages).

"Specifications for Nichia Chip Type Warm White LED, Model: NS6L083T", No. STSE-CC6063A, <Cat.No. 060609> Nichia Corporation, 1-3.

"Specifications for Nichia Chip Type White LED Model: NS6W083AT", No. STSE-CC7134, <Cat.No. 070706> Nichia Corporation , 1-14.

"TechniMask ISR 1000 Series", http://www.technic.com/pwb/solderisr1000.htm Technic, Inc. 2003, 1.

"Thermal Management for LED Applications Solutions Guide", *The Bergquist Company*, 1-6.

"T-lam System—Thermally Conductive Circuit Board Materials", http://www.lairdtech.com/pages/products/T-Lam-System.asp Feb. 21, 2008, 1-7.

Murray, Cameron T. et al., "3M Thermally Conductive Tapes", 3M Electronic Markets Materials Division Mar. 16, 2004, 1-39.

"3M Thermally Conductive Adhesive Transfer Tapes", 3M Electronic Adhesives and Specialties Department Engineered Adhesives Devision Sep. 2002, 1.

"3M Thermally Conductive Adhesive Transfer Tapes—Technical Data", *Electronic Adhesives and Specialties Department Engineered Adhesives Division* Sep. 2002, 1-6.

"Custom LUXEON Design Guide", *Application Brief AB12* Mar. 2006, 1-14.

"Data Sheet—DRAGONtape: DT6", Sep. 18, 2007, 1-4.

"Data Sheet—LINEARlight POWER Flex: LM10P", OSRAM SYLVANIA May 23, 2007, 1-4.

"DRAGONtape", *OSRAM Product Information Bulletin* Nov. 2004, 1-4.

"Final Office Action", mailed Mar. 15, 2012 in co pending U.S. Appl. No. 12/419,879, "Solid State Lighting Circuit and Controls"(10 pages).

"FLEX Connectors User's Guide", OSRAM SYLVANIA Oct. 2007, 1-6.

"FR406: High Performance Epoxy Laminate and Prepreg", http://www.isola-group.com/en/products/name/details.shtl?13 Mar. 3, 2008, 1.

"High Performance Epoxy Laminate and Prepreg", Isola Mar. 16, 2007, 1-3.

"IPC-4101B: Specification for Base Materials for Rigid and Multilayer Printed Boards", IPC Mar. 2006, 1-109.

"Kapton Polyimide Film", http://www2.dupont.com/Kapton/en_US/index.html DuPont Electronics Feb. 26, 2008, 1-9.

"Linear Products", http://www.sylvanaia.com/BusinessProducts/Innovations/LED=Systems/Linear/ OSRAM SYLVANIA 2004, 1.

"LINEARlight Flex & Power Flex LED Systems", http://www/sylvania.com/AboutUs/Pressxpress/Innovation/LightingNews(US)/2007/USLi... OSRAM SYLVANIA Sep. 2007, 1-3.

"LINEARlight FLEX TOPLED: Flexible LED Strip", *Osran Sylvania LED Systems Specification Guide 2007*, p. 100.

"LINEARlight POWER FLEX: Flexible High Light Output LED Modules", OSRAM SYLVANIA Apr. 2008.

"LINEARlight POWER FLEX: Flexible LED Strip", *Osran Sylvania LED Systems Specification Guide 2007*, p. 96.

"Nichia Application Note", Oct. 31, 2003, 5.

"Non Final Office Action", mailed Jul. 26, 2011 in co pending U.S. Appl. No. 12/419,879, "Solid State Lighting Circuit and Controls"(16 pages)., 16 Pgs.

"Non Final Office Action Received", mailed Mar. 5, 2012 in co pending U.S. Appl. No. 13/190,639, "Printed Circuit Board Interconnect Construction"(12 pages)., 12.

"NUD4001—High Current LED Driver", *Semiconductor Components Industries*, LLC http://onsemi.com Jun. 2006, 1-8.

"Product Information Bulletin DRAGONtape", OSRAM SYLVANIA 2007, 1-2.

"Product Information Bulletin HF2STick XB: Hi-Flux 2nd Generation Module", OSRAM SYLVANIA Jan. 2008, 1-4.

O'Malley, Kleran, "Using the NUD4001 to Drive High Current LEDs", http://onsemi.com Feb. 2005, 1-4.

\* cited by examiner

Fig. 5
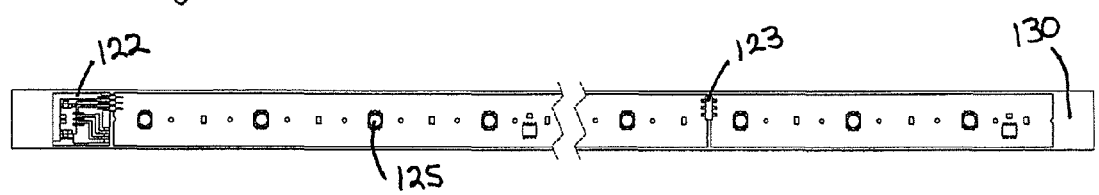
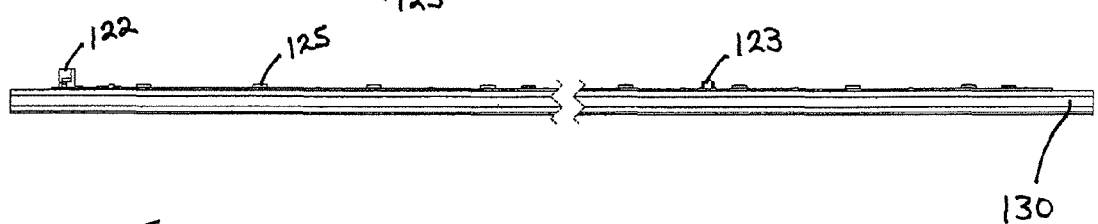
Fig. 6

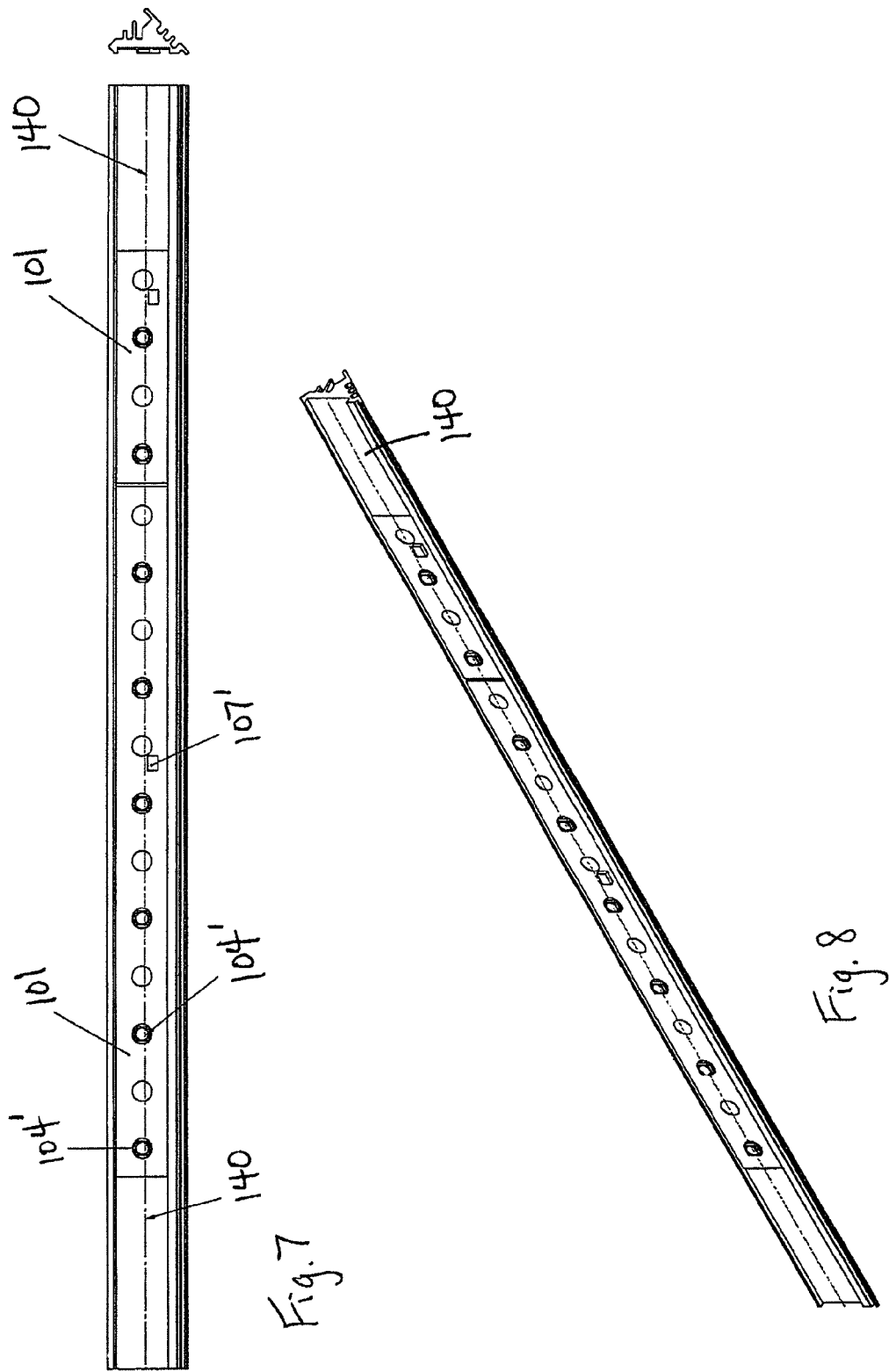

LAYERED STRUCTURE FOR USE WITH HIGH POWER LIGHT EMITTING DIODE SYSTEMS

This application is a continuation of U.S. application Ser. No. 12/043,424, filed Mar. 6, 2008, the contents of which are herein incorporated by reference.

FIELD OF THE INVENTION

The present invention relates to a layered structure for use with high power light emitting diode systems.

BACKGROUND OF THE INVENTION

Lighting systems utilizing multiple emitters or light emitting diodes (hereinafter "LEDs") are used in a variety of applications including but not limited to retail displays, refrigeration and freezer door systems, under cabinet lighting, track lighting, and cove lighting. Continuous strings of LEDs are often used in these applications and may be individually wired together or soldered onto printed circuit board substrates. Typical applications use standard circuit board materials such as Flame Retardant 4 (hereinafter "FR4") or Metal Core Printed Circuit Boards (hereinafter "MCPCBs"), which are typically rigid.

Designers of high power LED systems quickly adopted these standard circuit board materials due to their low cost and wide spread availability. The broadest applications focus on the use of aluminum clad MCPCBs in an attempt to transfer the high amount of heat generated from high power LEDs (1 W or higher). FR4 materials are known to be poor thermal solutions for high heat circuits as the electrically insulating layer results in poor thermal conductivity from the LED heat sink slug to the assembly heat sink. Thus, LED manufacturers typically recommend MCPCBs in place of FR4 for use in high power LED applications, such as Philips Lumileds Lighting Company in its Custom LUXEON® Design Guide, Application Brief AB12 (3/06). Standard circuit board materials are typically rigid material in form and do not conform to irregularities in heat sink surfaces. The standard circuit board materials are commonly screwed onto metal heat sinks with thermal grease placed between the aluminum clad and the assembly heat sink with some applications using thermal tape in place of mechanical fastening and thermal grease. Thermal grease and adhesive thermal tapes fill small voids of 0.002 inch or less due to surface irregularities but are not sufficient to fill larger voids or air gaps commonly occurring between standard circuit board materials and the assembly heat sinks due to the heat sinks being made out of flat, twisted, or curved surfaces. Issues with poor conductive interfaces quickly lead to failed LED systems in applications in the field due to voids or air gaps between the MCPCB or other substrate and the intended heat sink. These applications typically suffer from poor transfer of heat from the LED source to the heat sink due to poor conductive surface contact due to the board being too rigid to conform to the heat sink shape or to poor heat transfer through the board due to MCPCB thickness and layered structure properties.

More exotic solutions are available for LED systems including metal clad boards with thin, higher thermal conduction insulating layers or printed ceramic circuits onto steel or aluminum substrates. These materials provide better thermal management of high power LEDs over standard circuit board materials due to their higher thermally conductive materials but suffer from the same heat sink interface issues as the standard circuit board material and further at a severe sacrifice to system costs. Printed circuit board materials, such as T-lam™. Thermally Conductive Printed Circuit Board Materials by Laird Technologies, are one example of the more exotic, costly materials used to increase the thermal conductivity through the electrical insulating part of the structure.

LED systems are sought as energy efficient solutions to replace many established, less efficient lighting systems using common lighting sources such as incandescent, halogen, and fluorescent lighting sources. The introduction of LED systems into many general illumination and display applications is limited due to the high front end costs of LED systems. While the performance of the LEDs continue to climb and the cost of the LEDs continues to drop at rates consistent with other semiconductors following Mohr's Law, little is being done to reduce the costs related to the support systems necessary for high power LED systems such as board substrates.

The costs of assembling LED systems into lighting fixtures are further increased due to the labor intensive nature of applying rigid board materials with thermal grease, paste, or adhesive along with mechanical fastening of the rigid board materials to heat sinks Flexible tape and reel solutions have been developed for low wattage LED systems, however, these solutions are not applicable to high wattage LED systems due to the amount of heat generated by the higher wattage systems and the inherent poor thermal properties of the flexible materials such as DuPont™ Kapton™ polyimide film.

Therefore, there exists a need for a cost effective, high thermal performance substrate or solution for use with high power LED systems. The present invention addresses the problems associated with the prior art devices.

SUMMARY OF THE INVENTION

One aspect of the present invention provides a layered structure for use with a high power light emitting diode system comprising an electrically insulating intermediate layer interconnecting a top layer and a bottom layer. The top layer, the intermediate layer, and the bottom layer form an at least semi-flexible elongate member having a longitudinal axis and a plurality of positions spaced along the longitudinal axis. The at least semi-flexible elongate member is bendable laterally proximate the plurality of positions spaced along the longitudinal axis to a radius of at least 6 inches, twistable relative to its longitudinal axis up to 10 degrees per inch, and bendable to conform to localized heat sink surface flatness variations having a radius of at least 1 inch. The top layer is pre-populated with electrical components for high wattage, the electrical components including at least one high wattage light emitting diode at least 1.0 Watt per 0.8 inch squared.

Another aspect of the present invention provides a layered structure for use with a high power light emitting diode system comprising a top layer, a bottom layer, an electrically insulating intermediate layer, and a thermally conductive adhesive layer. The top layer includes 0.5 to 4.0 ounces per square foot of copper having first electrical circuits and protective coating, and the top layer is configured and arranged to receive at least one high wattage light emitting diode at least 1.0 Watt per 0.8 inch squared. The bottom layer includes 0.5 to 4.0 ounces per square foot of copper having second electrical circuits. The electrically insulating intermediate layer includes fiberglass 0.005 to 0.020 inch thick, and the intermediate layer interconnects the top layer and the bottom layer. The thermally conductive adhesive layer is operatively connected to the bottom layer on an opposing side to the intermediate layer. The top, intermediate, bottom, and adhesive layers have a thermal resistance of less than 1 to 5 degrees Celsius per Watt.

Another aspect of the present invention provides a method of making a layered structure. A first layer made of a first electrically conductive material, a second layer made of a second electrically conductive material, and an intermediate layer made of an electrically insulating thermally conductive material are obtained. The intermediate layer is sandwiched between the first layer and the second layer. A first electrical circuit is placed on a top surface of the first layer, and a portion of the top surface is coated with a protective coating. A second electrical circuit is placed on a bottom surface of the second layer. A plurality of high wattage electrical components are connected to the first electrical circuit, the high wattage electrical components including at least one high wattage light emitting diode at least 1.0 Watt per 0.8 inch squared.

Another aspect of the present invention provides a method of connecting a layered structure to a heat sink. The layered structure includes an electrically insulating intermediate layer interconnecting a top layer and a bottom layer. A thermally conductive adhesive layer is connected to the bottom layer and includes a removable backing. The top layer, the intermediate layer, the bottom layer, and the adhesive layer form an at least semi-flexible elongate member having a longitudinal axis and a plurality of positions spaced along the longitudinal axis. The at least semi-flexible elongate member is bendable laterally proximate the plurality of positions spaced along the longitudinal axis to a radius of at least 6 inches, twistable relative to its longitudinal axis up to 10 degrees per inch, and bendable to conform to localized heat sink surface flatness variations having a radius of at least 1 inch. The top layer is pre-populated with electrical components for high wattage, the electrical components including at least one high wattage light emitting diode at least 1.0 Watt per 0.8 inch squared. A desired length of the layered structure is determined, and the layered structure is cut into the desired length. The backing is removed from the adhesive layer of the desired length. The desired length is placed on a heat sink, pressure is applied on the desired length, and a termination board is connected to the desired length.

BRIEF DESCRIPTION OF THE DRAWINGS

FIG. 5 is a top view of the layered structure shown in FIG. 1 operatively connected to a first heat sink;

FIG. 6 is a side view of the layered structure operatively connected to the first heat sink shown in FIG. 5;

FIG. 7 is a top view of the layered structure shown in FIG. 1 operatively connected to a second heat sink;

FIG. 8 is a perspective view of the layered structure operatively connected to the second heat sink shown in FIG. 7;

DETAILED DESCRIPTION OF A PREFERRED EMBODIMENT

Figure 1:
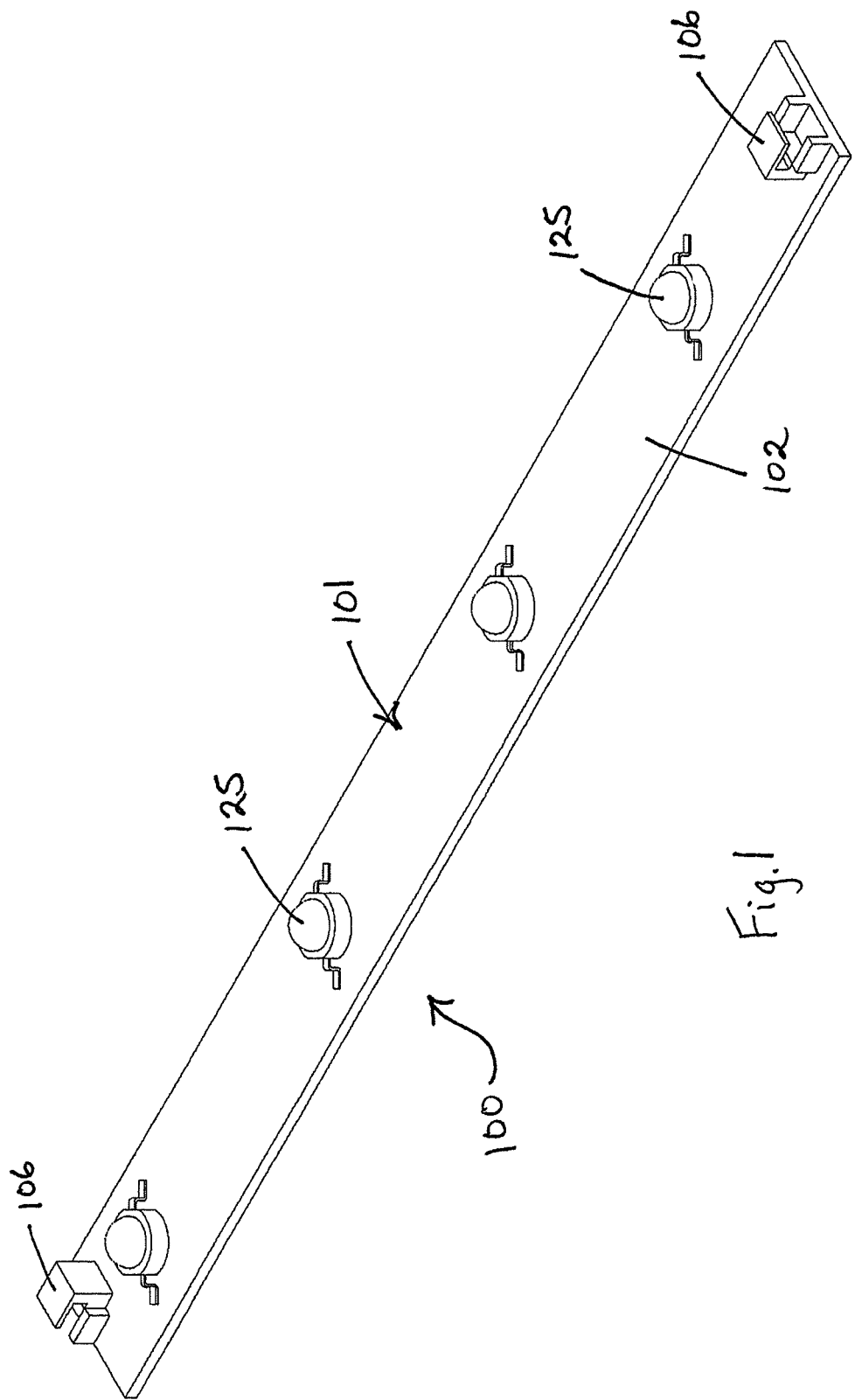
FIG. 1 is a perspective view of a layered structure for use with high power light emitting diode systems constructed according to the principles of the present invention with a plurality of light emitting diodes operatively connected thereto.

A preferred embodiment layered structure for use with high power light emitting diode systems constructed according to the principles of the present invention is designated by the numeral 100 in the drawings.

Figure 2:
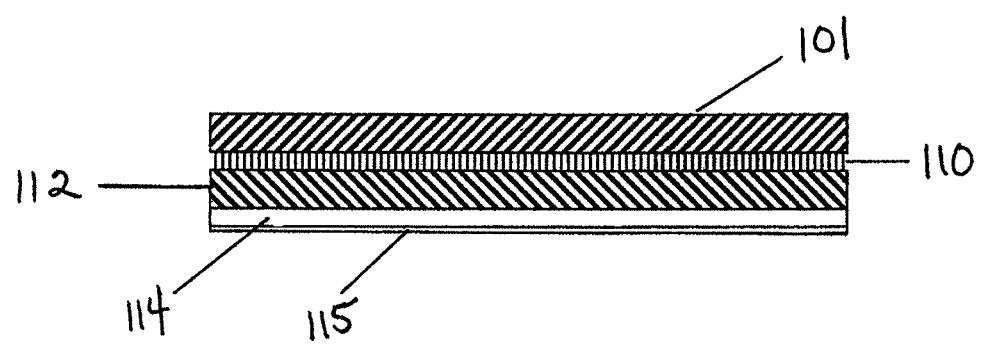
FIG. 2 is a cross-section view of the layered structure shown in FIG. 1.

As shown in FIG. 2, the layered structure 100 generally includes a top layer 101, an intermediate layer 110, and a bottom layer 112. Preferably, a commercially available FR4 material is used as a starting material and is modified to create the layered structure 100. The FR4 material preferably includes a layer of fiberglass sandwiched between two layers of copper. An example of a suitable FR4 material is FR406 manufactured by Isola Group of Chandler, Ariz. The top layer 101 includes one of the two layers of copper, the intermediate layer 110 includes the layer of fiberglass, and the bottom layer 112 includes the other of the two layers of copper. It is recognized that other suitable FR4 materials could be used and that these layers could be either manufactured or purchased in this form.

Prior to modification, the top layer 101 is preferably copper approximately 0.5 to 4.0 ounces per square foot and is approximately 0.0007 to 0.0056 inch thick, 0.25 to 18.00 inches wide, and 0.50 to 24.00 inches long. Although copper is the preferred material, it is recognized that other suitable electrically conductive materials such as but not limited to aluminum could be used. The top, copper layer is preferably modified to include a thermally conductive printed or etched electrical circuit 103 using standard electrical circuit design tools and techniques well known in the art and is then coated with a protective coating using standard solder masking and labeling techniques well known in the art. An example of a suitable protective coating that could be used is TechniMask ISR 1000 manufactured by Technic, Inc. of Cranston, R.I.

Figure 3:
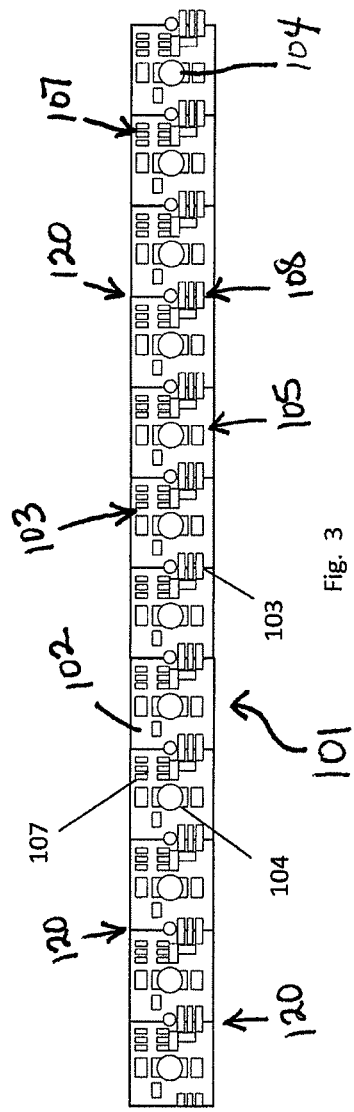
FIG. 3 is a top view of the layered structure shown in FIG. 1 with a thermally conductive top layer circuit printed thereon.

The top layer 101 is designed in such a way as to provide receptacles and mounting surfaces for LEDs 125 and other SMT electrical components proximate the top surface 102. The top surface 102 of the top layer 101 is shown in FIG. 3. The top layer 101 includes a plurality of LED receptacles 104 to which LEDs are operatively connected, driver locations 107, and jumper locations 108. The printed circuit 103, the LED receptacles 104, the driver locations 107, and the jumper locations 108 are preferably made of copper 105 and receive a hassel coating.

The intermediate layer 110 is not modified and is an electrically insulating thermally conductive layer preferably made of fiberglass approximately 0.005 to 0.020 inch thick, 0.25 to 18.00 inches wide, and 0.50 to 24.00 inches long. The fiberglass has a breakdown voltage of greater than 50 kilovolts (kV), a tensile strength of 55 kips per square inch (ksi), and a flexural strength of 91 kips per square inch (ksi). The thermal conductivity of the fiberglass is preferably 0.3 to 0.4 Watts per meter per ° Kelvin (W/mK). Although fiberglass is the preferred material, it is recognized that other suitable materials such as but not limited to polymer or ceramic blended dielectrics may be used.

Figure 4:
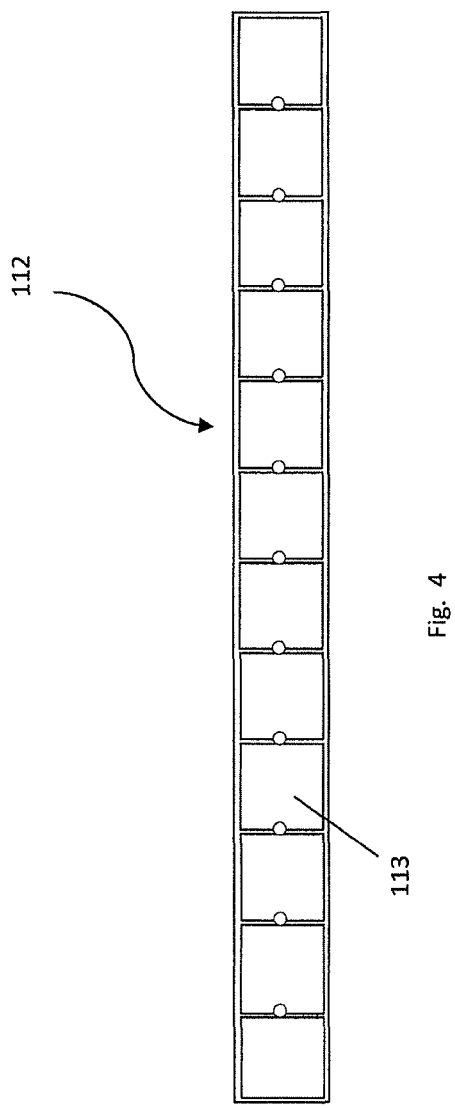
FIG. 4 is a bottom view of the layered structure shown in FIG. 1.

Prior to modification, the bottom layer 112 is preferably copper approximately 0.5 to 4.0 ounces per square foot and is approximately 0.0007 to 0.0056 inch thick, 0.25 to 18.00 inches wide, and 0.50 to 24.00 inches long. Although copper is the preferred material, it is recognized that other suitable electrically conductive materials such as but not limited to aluminum could be used. The bottom, copper layer is preferably modified into a heat spreading copper circuit laterally and along its longitudinal axis proximate the bottom surface using standard electrical circuit design tools and techniques well known in the art in order to rapidly spread the heat through the bottom layer 112. The exposed copper proximate the bottom surface of the bottom layer 112 is then tinned. The bottom surface of the bottom layer 112 is shown in FIG. 4. The bottom layer 112 includes thermally conductive printed circuits, which are printed or etched using solder mask printing, photo etching, and solder masking techniques well known in the art for producing electrical circuits.

Optionally, the layered structure 100 may also include an adhesive layer 114. The adhesive layer 114 is preferably a two-sided thermally conductive tape with two removable layers of protective backing One of the removable layers of protective backing is removed to expose one side of the adhesive, which is then operatively connected to the bottom surface of the bottom layer 112. When it is later desired to operatively connect the layered structure 100 to a heat sink, the second removable layer of protective backing 115 is removed to expose the other side of the adhesive. The adhesive layer 114 provides thermal contact between the layered structure 100 and the heat sink and is capable of filling voids and air gaps approximately 0.002 inch or less.

An example of a suitable adhesive layer is 3M™. Thermally Conductive Adhesive Transfer Tape 8810. Although a two-sided thermally conductive tape is preferably used, it is recognized that other suitable thermally conductive connecting materials could be used.

Figure 11:
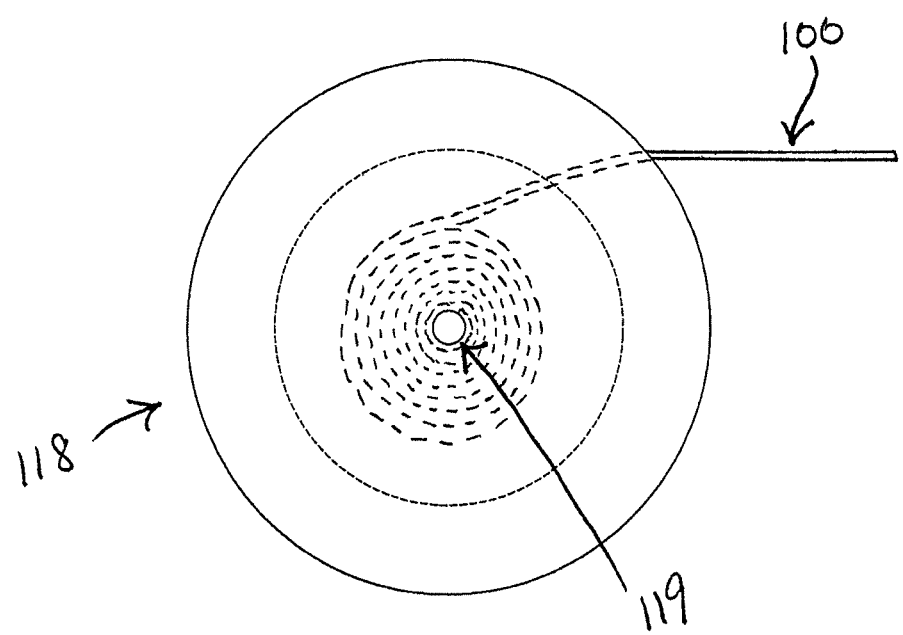
FIG. 11 is a side view of a reel onto which the layered structure shown in FIG. 1 could be wound.
Figure 14:
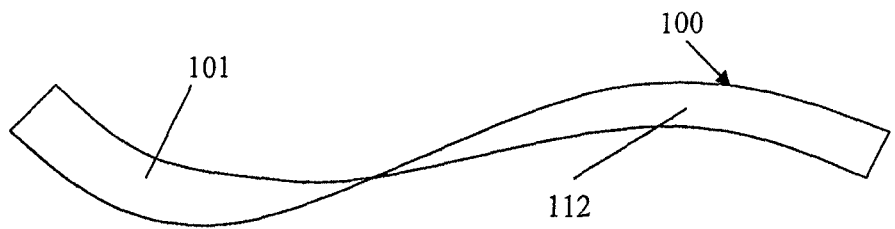
FIG. 14 is a top schematic view of the layered structure shown in FIG. 12 with a twist relative to its longitudinal axis.
Figure 12:
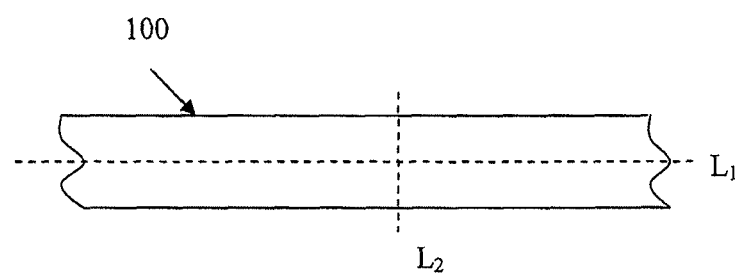
FIG. 12 is a top schematic view of the layered structure shown in FIG. 1.
Figure 13:
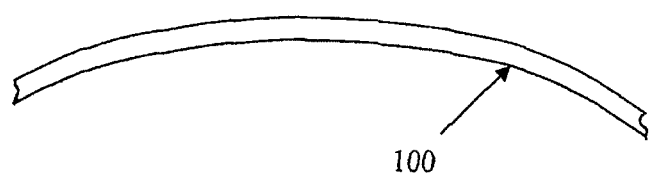
FIG. 13 is a side schematic view of the layered structure shown in FIG. 12.

The layered structure 100 is preferably an integral, layered structure that is at least semi-flexible, not rigid. Preferably, the layered structure 100, including the optional adhesive layer 114, is an elongate, at least semi-flexible, strip with a thickness of approximately 0.020 to 0.50 inch, a width of approximately 0.25 to 18.00 inches, and a length of any desired length, which could be as long as 250 feet or more. As shown in FIG. 12, the semi-flexible layered structure 100 has a longitudinal axis $L_1$. In this at least semi-flexible form, the strip can bend laterally, as shown in FIG. 13, along a plurality of positions $L_2$ (only one shown) spaced along the length of the longitudinal axis $L_1$ to a radius of 6 inches or greater and could be wrapped about a longitudinal axis of a hub 119 of a reel 118, as shown in FIG. 11. Although only one position $L_2$ is shown, it is recognized that there are a plurality of positions $L_2$ spaced along the length of the longitudinal axis $L_1$. Additionally, as shown in FIG. 14, the strip can also conform to twisting relative to its longitudinal axis $L_1$ of up to 10 degrees per inch. The strip can also bend to conform to localized heat sink surface flatness variations having a radius of at least 1 inch. FIG. 14 shows a layered structure 100 approximately 12 inches long twisted approximately 10 per inch. By conforming to variations in heat sink base material shapes, heat transfer from the LED heat sink slug is greatly improved over rigid board applications.

The layered structure 100 is pre-populated with a plurality of LEDs 125 and other Surface Mount Technology (hereinafter "SMT") electrical components well known in the art for completion of a solid state lighting electrical circuit cable of producing light. An example of a pre-populated layered structure could include the layered structure 100, a plurality of LEDs positioned longitudinally along the circuit approximately every 1.6 inches, linear drivers positioned longitudinally between every sixth LED and seventh LED, and connectors for power placed longitudinally approximately every 36 inches. An example of a suitable LED is 083A manufactured by Nichia Corporation of Detroit, Mich. An example of a suitable liner driver is NUD4001 manufactured by ON Semiconductor of Phoenix, Ariz.

FIG. 1 shows the layered structure 100 assembled and pre-populated with a plurality of LEDs and it is recognized that other SMT electrical components and circuits well known in the art could also be included. The layered structure 100 is at least semi-flexible and can conform to most curved, non-linear, and other irregular surfaces. Further, the layered structure 100 may be cut to any desired length using an ordinary scissors and cutting proximate the locations 120 indicated on the top layer 101 and the locations 121 indicated on the bottom layer 112. As shown in FIG. 6, a connector 122 is operatively connected to the layered structure to provide power to the LED system, and if it is desired to connect two layered structures together, a board to board connector 123 could be used. Such connectors are well known in the art.

Heat generated proximate the LED p-n junction is conducted from the LED chip to the LED heat sink slug as designed by the LED manufacturer. The LED heat sink slug typically is less than 0.25 inch in diameter or 0.050 inch squared proximate the LED's base. When electrically driven, the heat generated by the LED 125 and transferred to the LED heat sink slug can range from 1 to 5 Watts or more per 0.8 inch squared when applied to an adequate assembly heat sink. It is important to remove the heat away from the LED p-n junction in order to maintain the manufactures' specifications for normal operation proximate the p-n junction.

The layered structure 100 provides a path for heat to be spread through the thin top layer 101 (copper 105), through the electrically insulating intermediate layer 110, and into the bottom layer 112 (copper 113). The bottom layer 112 provides a path for the heat to spread laterally and longitudinally proximate over the top surface of the heat sink to which the layered structure 100 is operatively connected. The thermally conductive adhesive layer 114 provides an interface layer which fills the voids between the bottom layer 112 and the mounting surface of the heat sink. Should there be any voids or air gaps in the mounting surface of the heat sink, the thermally conductive adhesive layer 114 fills in the voids and air gaps up to 0.002 inch or less thus reducing the amount of voids and air gaps and increasing the amount of thermal transfer to the heat sink. The layered structure 100 conforms to the heat sink providing the necessary thermal transfer capabilities necessary for high wattage LED s. Should it be desired to connect a layered structure to another layered structure, a board to board connector 106 could be used.

The increased thermal performance of the layered structure 100 is achieved through four main aspects of the layered structure 100. First, the circuit design proximate the top surface of the top layer 101 increases the amount of copper 105, or other suitable conductive material, with thermal conductivity of 400 Watts per meter per ° Kelvin (W/mK) at the LED heat sink slug providing for rapid spreading of heat away from the LED 125. Second, the intermediate layer 110 provides electrical isolation of the LED 125 for proper electrical functionality with breakdown voltage greater than 50 kV. Third, the circuit design proximate the bottom layer 112 increases the amount of copper 113 with thermal conductivity of 400 W/mK and overlaps the copper 105 of the top layer 101 by the designed electrical circuit patterns to provide maximum heat transfer from the top layer 101, through the electrical isolation intermediate layer 110, and to the copper 113 of the bottom layer 112. Fourth, the thermally conductive adhesive layer 114 provides the final heat transfer path to the assembly heat sink.

The resulting system, including the layered structure 100 mounted to the assembly heat sink with adhesive layer 114, has a thermal resistance of less than 5 degrees Celsius per Watt ("° C./W"). This is compared to thermal resistances of greater than 5 degrees C./W for flexible electrical substrates such as DuPont™ Kapton™ polyimide film. Rigid electrical substrates such as Metal Core Printed Circuit Boards ("MCPCBs") as a material alone can achieve thermal resistances of less than 5 degrees C./W, but systems including MCPCBs have a thermal resistance much higher than 5 degrees C./W due to deficiencies in thermal interface to the heat sink. Mechanical attachment of MCPCBs produces irregular pressures and point contact against heat sink surfaces. Additional materials could be used to fill surface irregularities when using rigid electrical substrates, but these materials are limited to small gaps of 0.002 inch or less and do not work well on curved surfaces having radiuses of 48 inches or less producing voids or air gaps of greater than 0.002 inch or surfaces with localized bends of radii.

Figure 9:
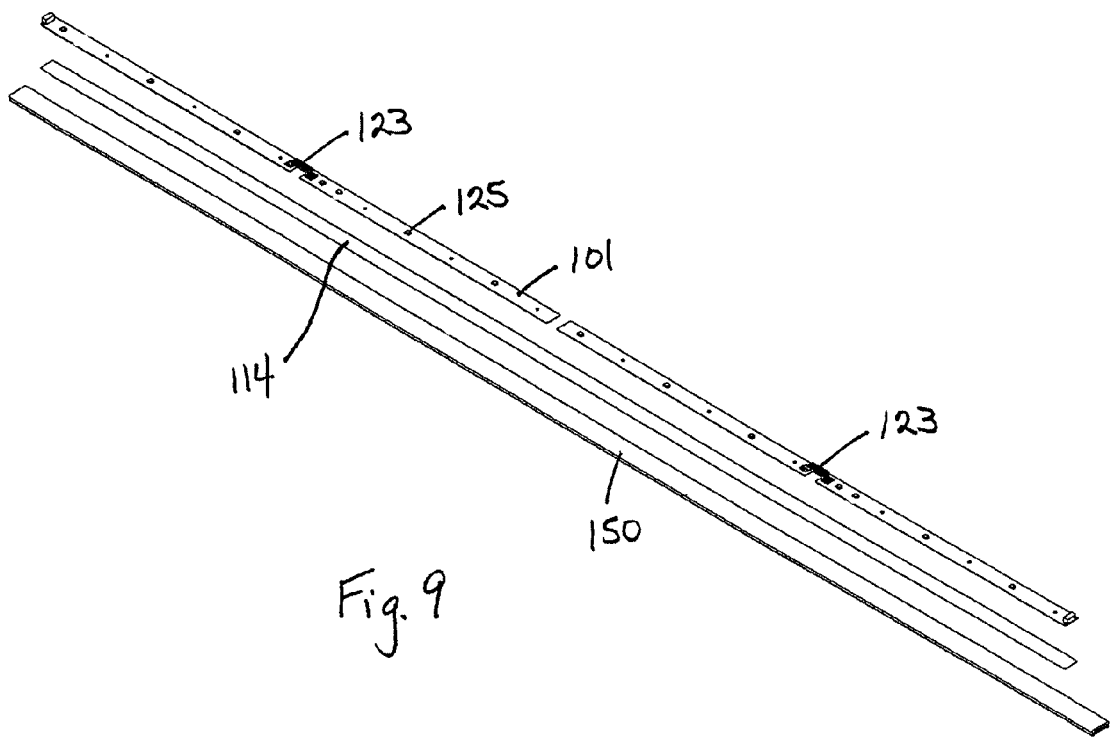
FIG. 9 is an exploded perspective view of the layered structure shown in FIG. 1 operatively connected to a third heat sink.

The layered structure 100 could be used for many different applications. One application includes the production of light bars for retail display fixtures, an example of which is shown in FIGS. 5 and 6 and another example of which is shown in FIGS. 7 and 8. FIG. 7 shows a top layer 101 with LED receptacles 104' and driver locations 107'. Another application includes the production of light bars for vertical refrigeration applications, an example of which is shown in FIG. 9. These applications include extruded aluminum heat sinks 130, 140, and 150 onto which the pre-populated, at least semi-flexible layered structure 100 is connected. The at least semi-flexible layered structure 100 is printed with the electrical circuit design 103 as described above and then pre-populated with LEDs 125 and other SMT electrical components as desired. The pre-populated, at least semi-flexible layered structure 100 is then either stored for later attachment to the heat sink or is immediately applied to the heat sink.

Figure 10:
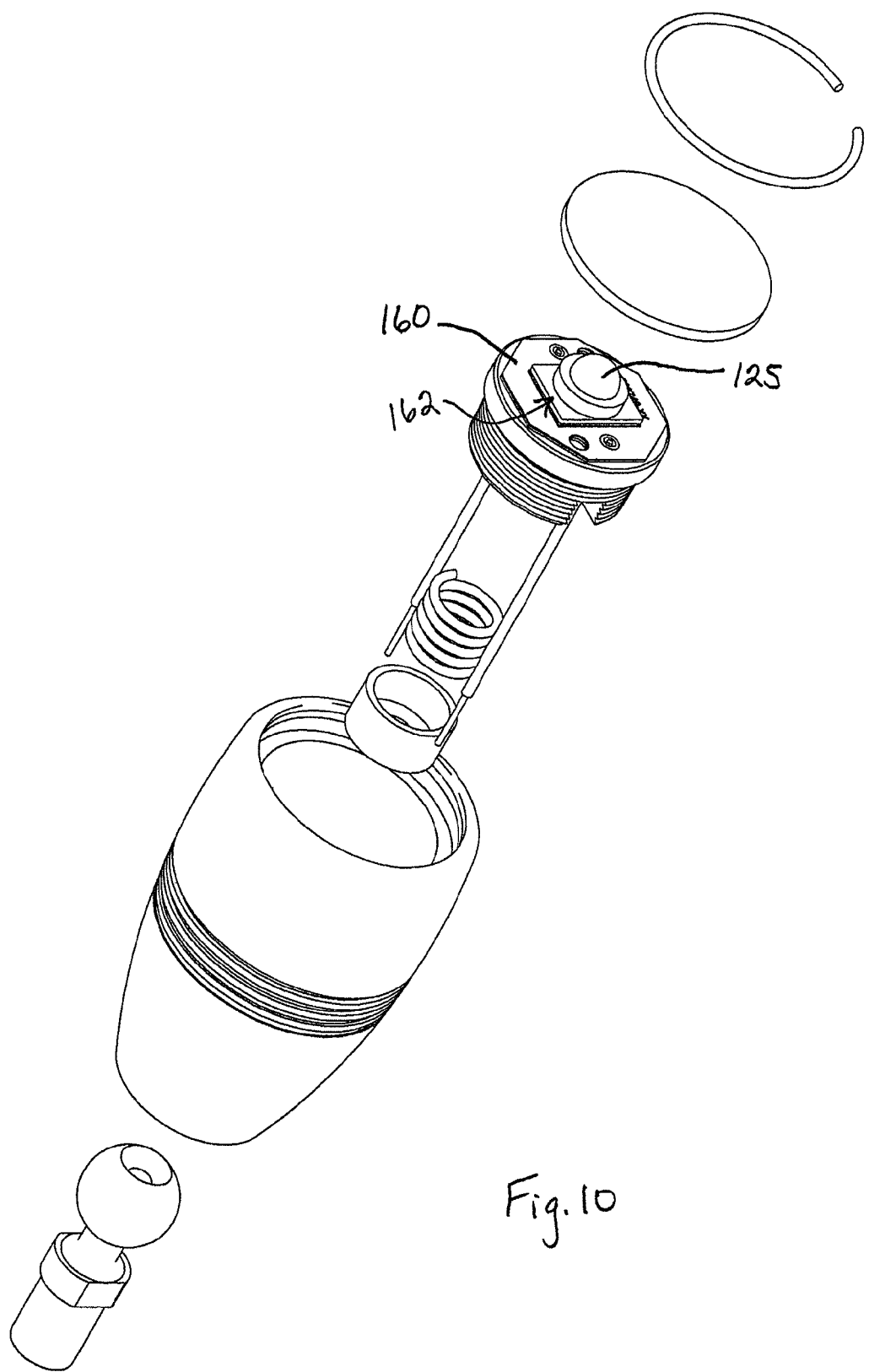
FIG. 10 is an exploded perspective view of the layered structure shown in FIG. 1 operatively connected to a fourth heat sink.
Figure 15:
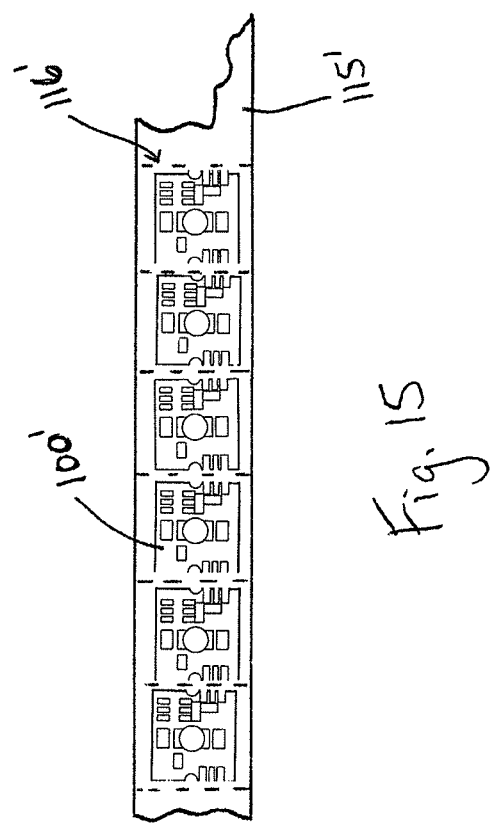
FIG. 15 is a top view of a "peel and stick" layered structure for use with high power light emitting diode systems constructed according to the principles of the present invention.

Another example is shown in FIG. 10, which shows another embodiment of the present invention. An individual "peel and stick" LED and associated components could be positioned along a continuous strip of backing, which could be perforated, wound about a reel 118 as shown in FIG. 11, and removed individually from the backing An example of a possible "peel and stick" strip including individual layered structures 100' along a strip of backing 115' with perforations 116' is shown in FIG. 15. In FIG. 10, the heat sink to which the LED and associated components 162 is a mounting surface 160 on a spot light. The individual assemblies could be used individually or connected to other individual assembles. Although only one LED is shown in FIG. 10, it is recognized that any desired number of LEDs and associated components could be "peel and stick" from a continuous strip of backing.

Operatively connecting the pre-populated, at least semi-flexible layered structure 100 to the heat sink includes removing the layered structure 100 from its storage container, paying out a desired length of the layered structure from the reel and cutting the desired length (if applicable), removing the protective backing 115 (if applicable), placing the layered structure 100 onto a desired location on the heat sink, and applying pressure onto the layered structure 100 proximate the top layer avoiding any sensitive electrical components (if applicable). Standard electro static discharge ("ESD") precautions should be followed. Direct pressure should not be applied to pressure sensitive devices, such as LEDs with optical components. Manual pressure with one's finger(s) of approximately 2 pounds per square inch along 90% or more of the layered structure should be sufficient for connection to the heat sink. A roller or other applicator device could also be used. Once the layered structure 100 is connected to a heat sink, the circuits are connected to a termination board, which supplies power to the system as is well known in the art. If an adhesive layer is not used, the layered structure could be connected with thermal paste adhesive, thermal grease with mechanical fastening, or other suitable securing means.

The layered structure is a low cost, at least semi-flexible structure consisting in part of a very thin and flexible printed circuit substrate and a thermally conductive adhesive layer, which when operatively connected to a heat sink produces a superior thermal interface with the heat sink thus achieving overall superior system thermal performance. The circuit structure is designed in such a way as to allow the copper pads on the top layer to spread heat across the top surface. The thin, electrically insulating intermediate layer allows conduction of heat from the copper circuit area on the top surface to an even larger (nearly full coverage) copper on the bottom layer.

At least one high power LED is soldered onto the desired LED receptacle on the top surface of the layered structure. When electrical current is passed through the circuit on the top surface of the top layer, the at least one LED is energized and emits visible light. Based on the heat sink structure of the high power LED lamp, heat generated from the electrical current passed through the LED is conducted to a heat sink slug on the bottom of the LED. The efficiency of the LED and corresponding light output performance is a direct function of the junction temperature ("Tj") of the LED with heat reducing the efficiency of light production according to the manufacturer's specifications. The layered structure of the present invention works to rapidly spread heat away from the LED heat sink slug proximate the top surface and correspondingly rapidly conducts heat away from the top conductive copper circuit layer, into the bottom electrically isolated copper area, into the heat sink, and into the surrounding air or structure.

The layered structure includes thermally conductive copper portions proximate both the top and bottom layers, which are used to communicate heat flow through the less conductive intermediate layer, while at the same time maintaining the at least semi-flexible properties of the layered structure. The rapid spreading of heat away from the LEDs leads to lower Tj values, higher light output, and higher component reliability. Another benefit of an at least semi-flexible, layered structure is the further enhancement of thermal performance due to the ability of the thin thermally conductive adhesive layer to conform to both the copper portion of the bottom layer and the eventual heat sink. The ability of the at least semi-flexible, layered structure to conform to the eventual heat sink allows for improved intimate thermal contact on curved and less than perfectly flat heat sink surfaces.

Additional benefits of the at least semi-flexible, layered structure are the utility and cost savings of building reeled, pre-populated, high wattage LED systems. Current reeled LED systems are available for lower wattage LEDs (½ Watt or lower per 0.75 inch squared but do not exist for higher wattage LEDs (greater than ½ Watt per 0.75 inch squared. The at least semi-flexible, layered structure provides a substrate on which surface mounted, higher wattage LEDs can be mounted and then reeled onto a 6 inches diameter or larger cored reel. Reeled continuous linear strips of high wattage LEDs can be easily handled and applied to linear heat sinks during manufacturing assembly. Alternative methods with standard circuit board materials require individual boards, which require additional handling, labor, and packaging, adding cost and slowing production.

The above specification, examples and data provide a complete description of the manufacture and use of the composition of the invention. Since many embodiments of the invention can be made without departing from the spirit and scope of the invention, the invention resides in the claims hereinafter appended.

We claim:

1. A layered structure for use with a light emitting diode system, comprising:
   an electrically insulating intermediate layer interconnecting a top layer and a bottom layer;
   the top layer, the intermediate layer, and the bottom layer forming an at least semi-flexible elongate member having a longitudinal axis, the at least semi-flexible elongate member having sufficient flexibility to be bent along the longitudinal axis to a radius of curvature of 6 inches; and
   the top layer being pre-populated with electrical components, the electrical components including at least one light emitting diode.

2. The layered structure of claim 1, wherein the bottom layer is 0.0007 to 0.0056 inches thick.

3. The layered structure of claim 1, wherein the top layer includes 0.5 to 4.0 ounces per square foot of copper, the intermediate layer includes fiberglass 0.005 to 0.020 inch thick, and the bottom layer includes 0.5 to 4.0 ounces per square foot of copper.

4. The layered structure of claim 1, further comprising a thermally conductive adhesive layer connected to the bottom layer, the adhesive layer being configured and arranged to fill voids up to 0.002 inch.

5. The layered structure of claim 4, wherein the top, intermediate, bottom, and adhesive layers have a low thermal resistance.

6. The layered structure of claim 5, wherein the top, intermediate, bottom, and adhesive layers have a thermal resistance of less than 5 degrees Celsius per Watt.

7. The layered structure of claim 1, wherein the layered structure is wound about a hub of a reel.

8. The layered structure of claim 1, the electrical components including at least one light emitting diode greater than 0.5 Watt per 0.75 inch squared.

9. A layered structure for use with a light emitting diode system, comprising:
   an electrically insulating intermediate layer interconnecting a top layer and a bottom layer, the intermediate layer having a thickness of between 0.005 and 0.020 inches, the bottom layer having a thickness of between 0.0007 and 0.0056 inches;
   the top layer, the intermediate layer, and the bottom layer forming an at least semi-flexible elongate member having a longitudinal axis, the at least semi-flexible elongate member having sufficient flexibility to be bent along the longitudinal axis to a radius of curvature of 6 inches; and
   the top layer being pre-populated with electrical components, the electrical components including at least one light emitting diode.

10. The layered structure of claim 9, wherein the top layer includes 0.5 to 4.0 ounces per square foot of copper, the intermediate layer includes fiberglass 0.005 to 0.020 inch thick, and the bottom layer includes 0.5 to 4.0 ounces per square foot of copper.

11. The layered structure of claim 9, further comprising a thermally conductive adhesive layer connected to the bottom layer, the adhesive layer being configured and arranged to fill voids up to 0.002 inch.

12. The layered structure of claim 11, wherein the top, intermediate, bottom, and adhesive layers have a low thermal resistance.

13. The layered structure of claim 12, wherein the top, intermediate, bottom, and adhesive layers have a thermal resistance of less than 5 degrees Celsius per Watt.

14. The layered structure of claim 9, wherein the layered structure is wound about a hub of a reel.

15. The layered structure of claim 9, the electrical components including at least one light emitting diode greater than 0.5 Watt per 0.75 inch squared.

16. A layered structure for use with a light emitting diode system, comprising:
   an electrically insulating intermediate layer interconnecting a top layer and a bottom layer;
   the top layer, the intermediate layer, and the bottom layer forming an at least semi-flexible elongate member having a longitudinal axis; and
   the top layer being pre-populated with electrical components including at least one light emitting diode;
   wherein the layered structure is wound around a hub of a reel.

17. The layered structure of claim 16, the reel having a core with a diameter of six inches or more.

18. The layered structure of claim 16, wherein the bottom layer is 0.0007 to 0.0056 inches thick.

19. The layered structure of claim 16, wherein the top layer includes 0.5 to 4.0 ounces per square foot of copper, the intermediate layer includes fiberglass 0.005 to 0.020 inch thick, and the bottom layer includes 0.5 to 4.0 ounces per square foot of copper.

20. The layered structure of claim 16, further comprising a thermally conductive adhesive layer connected to the bottom layer, the adhesive layer being configured and arranged to fill voids up to 0.002 inch.

21. The layered structure of claim 20, the adhesive layer including a backing, the backing being removable.

22. The layered structure of claim 20, wherein the top, intermediate, bottom, and adhesive layers have a low thermal resistance.

23. The layered structure of claim 22, wherein the top, intermediate, bottom and adhesive layers have a thermal resistance of less than 5 degrees Celsius per Watt.

24. The layered structure of claim 16, the electrical components including at least one light emitting diode greater than 0.5 Watt per 0.75 inch squared.

* * * * *